United States Patent [19]

van Roermund

[11] 4,455,666
[45] Jun. 19, 1984

[54] COMPENSATION OF 1ST ORDER TRANSFER INEFFICIENCY EFFECT IN A C.T.D.

[75] Inventor: Arthur H. M. van Roermund, Eindhoven, Netherlands

[73] Assignee: U.S. Philips Corporation, New York, N.Y.

[21] Appl. No.: 369,789

[22] Filed: Apr. 19, 1982

[30] Foreign Application Priority Data

Apr. 29, 1981 [NL] Netherlands .......................... 8102100

[51] Int. Cl.³ ...................... G11C 11/34; G11C 19/28; H03K 17/16
[52] U.S. Cl. ......................................... 377/58; 377/59; 377/60
[58] Field of Search .............................. 377/58, 60, 59

[56] References Cited

U.S. PATENT DOCUMENTS

| 4,156,152 | 5/1979 | Butler et al. | 377/58 |
| 4,156,818 | 5/1979 | Collins et al. | 377/58 |
| 4,185,324 | 1/1980 | Ward | 377/58 |
| 4,303,839 | 12/1981 | Berger et al. | 377/58 |

Primary Examiner—John S. Heyman
Attorney, Agent, or Firm—Robert T. Mayer; Steven R. Biren

[57] ABSTRACT

Charge transfer devices exhibit transfer inefficiencies, so that a part of a transferred charge packet is left and lags the original charge packet. This results in "smearing" of the original charge packet, thereby adversely affecting the unit-function response and the frequency response of the charge transfer device. The invention provides a solution to this problem, utilizing a compensation charge derived from the original charge packet, which at a suitable instant is applied to a point where the residual charge is cancelled via a feedback loop.

14 Claims, 9 Drawing Figures

COMPENSATION OF 1ST ORDER TRANSFER INEFFICIENCY EFFECT IN A C.T.D.

BACKGROUND OF THE INVENTION

The invention relates to a charge transfer device comprising a series of similar semiconductor cells each having an input, an output and a capacitance for the storage of a charge which represents information and at least one control electrode for charge-transfer, the input of substantially each cell being coupled to the output of the preceding cell and control means being provided for applying clock signals to the control electrodes of consecutive cells in accordance with a cyclic permutation in order to control the charge transfer in the charge transfer device.

Charge transfer devices of the aforementioned type are inter alia known from U.S. Pat. No. 3,666,972. These devices have the drawback that during transfer of a signal charge packet from one cell of the charge transfer device to a following cell a residual charge remains in the first-mentioned cell, so that firstly the magnitude of the charge packet transfer decreases and secondly the residual charge is added to a following signal charge packet which passes through. Obviously, the first effect can be overcome by linear amplification of the attenuated signal charge packet. However, the second effect gives rise to "smearing" of the signal charge packet, so that the next signal charge packet is distorted under the influence of its predecessor. A description of this problem can be found in the report of the "Third International Conference on the Technology and Application of Charge Coupled Devices" held in September 1976 at Edingburgh, in an article by Chowaniec and Hobson on pages 227-231, entitled: "An Analysis of CCD Recursive Filters with Application to MTI Radar Filters."

Until now solutions to the smearing problem were directed to improving the basic cell itself, but this gives rise to complications, because such an improvement should be applied as many times as the number of cells contained in the charge transfer device.

SUMMARY OF THE INVENTION

It is an object of the invention to provide a charge transfer device which largely mitigates said smear effect, without modifying the individual cells. To this end the charge transfer device according to the invention is characterized in that the device comprises a detector which is coupled to the output of one of the cells for detecting the magnitude of a signal charge packet on said output and therefrom deriving a compensation charge packet and that the device further comprises a feedback path for adding said compensation charge packet in a compensating sense to the charge packet which lags said charge packet by one clock period. By the compensation of the residual charge, which lags the original signal charge packet by one clock period, the next signal charge packet which passes is not disturbed by the residual charge. This compensation, in accordance with the invention, can be obtained by deriving a compensation charge from the original charge packet and adding said compensation charge to the next signal charge packet immediately or after a lapse of time. Thus, it is not necessary to improve the individual cells, so that substrate area is saved, and in addition this is more effective than provisions applied to each individual cell.

It is advantageous if the compensation charge is derived from the signal charge packet without said signal charge packet being disturbed. To this end, the charge transfer device in accordance with the invention is characterized in that said detector comprises a buffer amplifier with a high-ohmic input and a low-ohmic output and a first capacitor.

It may be advantageous, in accordance with the invention, to add the compensation charge, which has been taken from a specific point, immediately to the next signal charge packet, which is located two or more cells back in the charge transfer device. To this end, the charge transfer device in accordance with the invention is characterized in that the buffer amplifier is inverting and its input is connected to the output of one of the cells of the charge transfer device, of which cell the control electrode can be controlled by a first clock signal, one of the electrodes of the first capacitor being connected to the output of the buffer amplifier via the main current path of a first transistor, the main current path of a second transistor being arranged in parallel with the first capacitor and the other electrode of the first capacitor being connected to the output of the cell, of which cell the control electrode can also be controlled by the first clock signal and which cell precedes the said cell.

It may also be advantageous when the compensation charge taken from a specific point during a part of the clock period is stored and subsequently is added to the next signal charge packet at a preceding point in the charge transfer device. To this end the charge transfer device in accordance with the invention is characterized in that the buffer amplifier is non-inverting and its input, via the main current path of a third transistor, is connected to the output of one of the cells of the charge transfer device, whose control electrode can be controlled by a first clock signal, the input of the buffer amplifier further being connected to the input of said cell via the main current path of a fourth transistor, the output of the buffer amplifier being connected to one of the electrodes of the first capacitor, the other electrode of the first capacitor being connected to a point of a fixed potential via the main current path of a fifth transistor and to the input of said cell via the main current path of a sixth transistor.

Further, it may be advantageous to store the compensation charge taken from a specific point for one clock period and subsequently add it to the next signal charge packet at the same point. To this end the charge transfer device in accordance with the invention is characterized in that the buffer amplifier is non-inverting and a second capacitor forms part of said detector, the input of a buffer amplifier being connected to the output of one of the cells of the charge transfer device, whose control electrode can be controlled by a first clock signal, the input of the buffer amplifier further being controlled via the main current path of a seventh and an eighth transistor respectively, to the one electrode of the first and the second capacitor respectively, the one electrode of the first and the second capacitor being connected to a point of fixed potential via the main current path of a ninth and a tenth transistor respectively and the other electrode of the first capacitor or the second capacitor being connected to the output of the buffer amplifier.

It is advantageous to avoid the use of switching transistors by employing, in accordance with the invention, a circuit in which charge storage and delivery is effected automatically via the polarity of the signal voltages. An embodiment of the charge transfer device in accordance with the invention is therefore characterized in that said detector comprises a further buffer amplifier with a high-ohmic input and a low-ohmic output, the buffer amplifier and the further buffer amplifier being non-inverting and only those input signal values which exceed a specific threshold value being transferred, the input of the buffer amplifier being connected to the input of one of the cells of the charge transfer device, the input of a further buffer amplifier being connected to the output of the said one of the cells, the first capacitor being arranged between the input and the output of the buffer amplifier and the outputs of the buffer amplifier and the further buffer amplifier being interconnected via a coupling circuit.

It is advantageous if the buffer amplifiers in accordance with the invention are as simple as possible. For this purpose a further embodiment of the charge transfer device in accordance with the invention is characterized in that the buffer amplifier and the further buffer amplifier each comprise a transistor arranged as a follower.

In accordance with the invention it is advantageous to have control of the ratio between the magnitude of the signal charge packet and that of the compensation charge when designing the device. A further embodiment of the charge transfer device in accordance with the invention is therefore characterized in that the coupling circuit is a resistive attenuator.

Furthermore, it may be advantageous if in a charge transfer device in accordance with the invention said ratio can be influenced externally. To this end an embodiment of the charge transfer device in accordance with the invention is characterized in that at least one of the resistors of the coupling circuit is a variable resistor.

BRIEF DESCRIPTION OF THE DRAWING

The invention will now be described in more detail with reference to the drawing, in which:

FIGS. 2a, 2b and 2c show block diagrams of three different versions of a feedback path in a two-phase charge transfer device, via which a compensation charge derived from a signal charge packet can be added to the next signal charge packet, of which FIG. 2a represents a feedback path which imposes no delay, FIG. 2b represents a feedback path which causes a delay by a fraction of the clock period, FIG. 2c represents a feedback path which causes a delay of a full clock period;

DESCRIPTION OF THE PREFERRED EMBODIMENTS

As already stated in the introduction, a small part of the signal charge packet remains in the first cell when transferring a signal charge packet from one cell to the next cell. This effect is referred to as "transfer inefficiency". As the present system is a time-discrete system, the transfer from one or more cells is best illustrated by means of the z-transform. This transform may be regarded as a general version of the well-known Fourier transform, as is described on page 45 ff. of the book "Digital Signal Processing" by Oppenheimer and Schafer, Prentice Hall Inc. 1975. Similarly to the Fourier transform, a definition equation is valid for the z-transform:

$$X(z) = \sum_{n=-\infty}^{\infty} x(n)z^{-n}$$

where $x(n)$ is a series of signal samples defined at discrete instants, while in the present case it is assumed, for the sake of simplicity, that $z = e^{-j\omega}$ and z is consequently a complex number with $|z|=1$, $X(z)$ then being the z-transform of $x(n)$. If the series of signal samples is delayed by one sampling period, $x(n)$ becomes $x(n-1)$ and:

$$X'(z) = \sum_{n=-\infty}^{\infty} x(n-1)z^{-n}.$$

where $X'(z)$ is the z-transform of the delayed series of signal samples $x(n-1)$. This may also be written:

$$X'(z) = z^{-1} \sum_{n=-\infty}^{\infty} x(n-1)z^{-(n-1)} =$$

$$z^{-1} \sum_{i=-\infty}^{\infty} x(n)z^{-n} = z^{-1} X(z).$$

In the z-domain a delay by one sampling period is therefore represented by a multiplication by $z^{-1}$. In the case of a two-phase charge transfer device a charge sample is shifted by two cells during one clock period, so that the transfer from one cell without transfer inefficiency may be represented by:

$$\frac{X'(z)}{X(z)} = H_1(z) = z^{-\frac{1}{2}}$$

Figure 1:
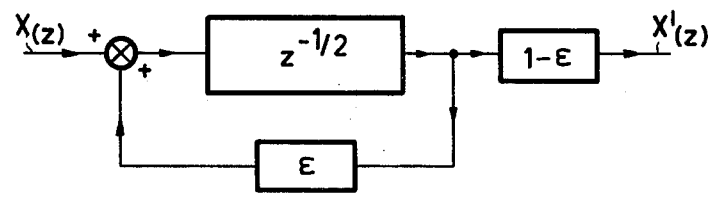
FIG. 1 is a block diagram of a delay stage of a charge transfer device, in which a transfer inefficient occurs.

If the cells exhibit transfer inefficiency then, after a signal packet has just passed through a cell, a small fraction $\epsilon$ of said packet will be left in the cell, which after one clock period is added to the next signal charge packet, while a portion $1-\epsilon$ of the original signal charge packet remains. The transfer of a cell may then be written:

$$\frac{X'(z)}{X(z)} = H_2(z) = \frac{z^{-\frac{1}{2}}}{1 - \epsilon Z^{-\frac{1}{2}}}(1-\epsilon)$$

which is illustrated by means of FIG. 1, which represents the block diagram of a cell of a charge transfer device which exhibits transfer inefficiency. In the case of 2n cells arranged after each other this becomes:

$$H_{2n}(z) = \frac{z^{-1}}{(1-\epsilon z^{-\frac{1}{2}})^{2n}}(1-\epsilon)^{2n}$$

which is a 1st-order approximation may be written:

$$H_{2n}(z) = z^{-n}(1 - 2n\epsilon)(1 + 2n\epsilon z^{-1})$$

Figure 2A:
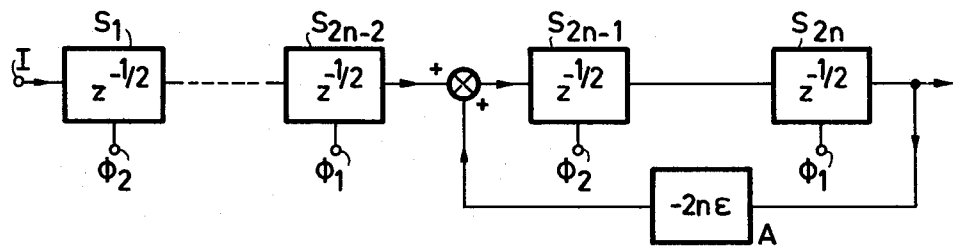
Figure 2B:
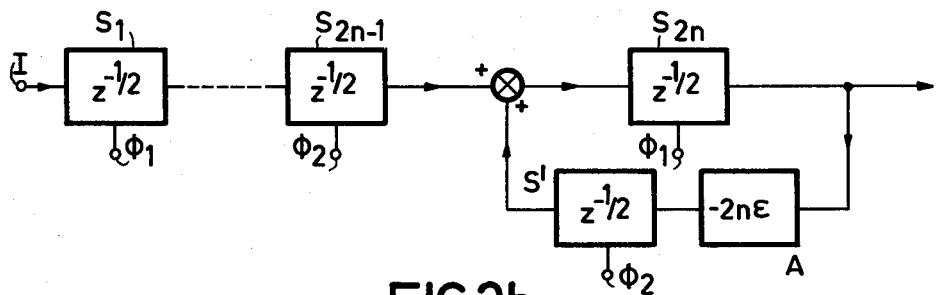
Figure 2C:
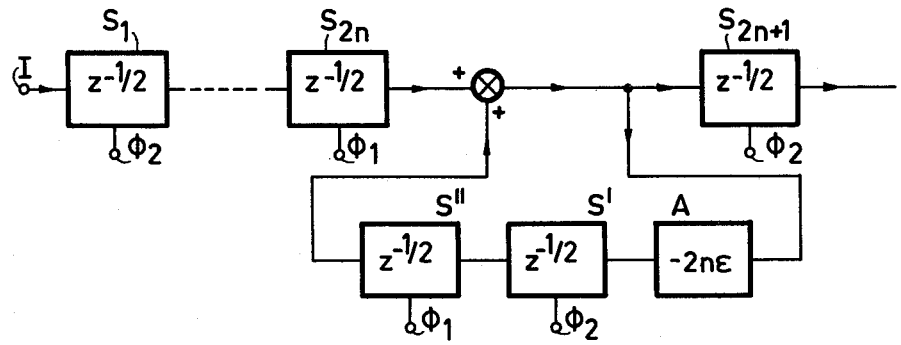

The most annoying factor in said transfer is $(1 + 2n\epsilon z^{-1})$, because this leads to smearing of the signal charge packets and thereby causes the lagging residual charge. The transfer may be improved by compensation of said factor. It will now be demonstrated that this is possible as regards the 1st-order term by means of the three embodiments of the charge transfer device in accordance with the invention, whose block diagrams are shown in FIGS. 2a, 2b and 2c. The input of each cell ($S_1 \ldots S_{2n}$) of such a charge transfer device is connected to the output of the preceding cell, except the input of the cell $S_1$, which is connected to the signal input I, to which in known manner signal samples in the form of charge packets are applied. Under the influence of the clock signals $\phi_1$ and $\phi_2$ said signal charge packets are transferred from the left to the right through the chain of cells.

In the charge transfer device shown in FIG. 2a a compensation charge packet is taken from the output of the cell $S_{2n}$, which packet is attenuated by a factor $-2n\epsilon$ via the attenuator circuit A and is inverted and applied to the input of the preceding cell $S_{2n-1}$. This is not attended by a delay in the feedback path via the block A. In the charge transfer device in accordance with FIG. 2b a compensation charge is taken from the output of the cell $S_{2n}$, which via the attenuator circuit A and the cell $S'$ is attenuated, delayed, inverted and applied to the input of the same cell $S_{2n}$. Finally, in the charge transfer device in accordance with FIG. 2c the compensation charge is taken from the output of the cell $S_{2n}$ and applied to the same point after having been delayed, attenuated and inverted in the feedback loop comprising the attenuator A and the cells $S'$ and $S''$.

For the two-phase charge transfer device, whose block diagram is shown in FIG. 2a, the transfer may be represented by:

$$H'_{2n}(z) = \left(\frac{(1-\epsilon)z^{-\frac{1}{2}}}{1-\epsilon z^{-\frac{1}{2}}}\right)^{2n-2} \cdot \frac{\left(\frac{(1-\epsilon)z^{-\frac{1}{2}}}{1-\epsilon z^{-\frac{1}{2}}}\right)^2}{1 + \left(\frac{(1-\epsilon)z^{-\frac{1}{2}}}{1-\epsilon z^{-\frac{1}{2}}}\right)^2 2n\epsilon}$$

or $$H'_{2n}(z) \simeq z^{-1}(1-2n\epsilon)(1+2n\epsilon z^{-1}) \cdot \frac{1}{(1+2\epsilon z^{-1})}$$

which in a 1st-order approximation yields:

$$H'_{2n}(z) = z^{-n}(1-2n\epsilon)$$

(Here it is assumed that $zn\epsilon \ll 1$). This shows that the smearing effect is suppressed and that only a linear attenuation factor $(1-2n\epsilon)$ remains. In a similar way the same transfer formulas can be derived for the block diagrams of FIGS. 2b and 2c. It will be evident that in the charge transfer devices in accordance with FIGS. 2a, 2b and 2c the cell $S_{2n}$ may be followed by further cells.

Figure 3:
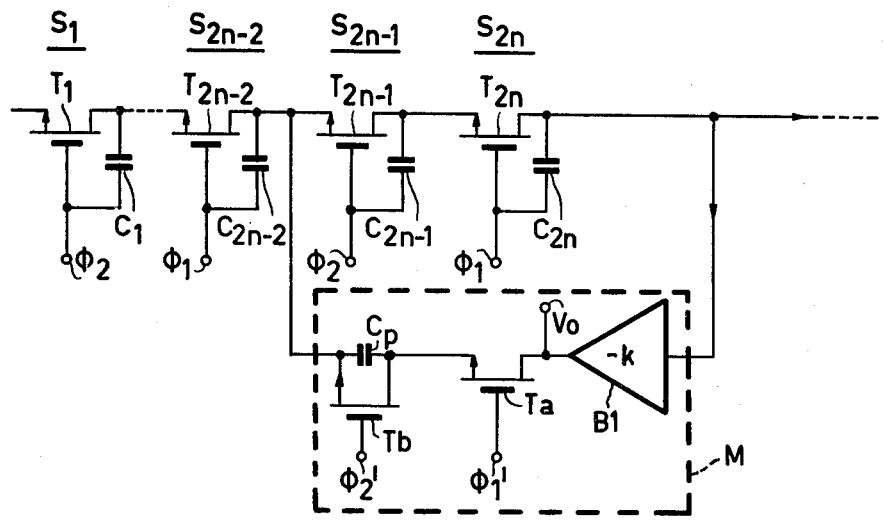
FIG. 3 shows a part of an embodiment of the charge transfer device in accordance with the invention comprising a feedback loop without a delay.
Figure 7:
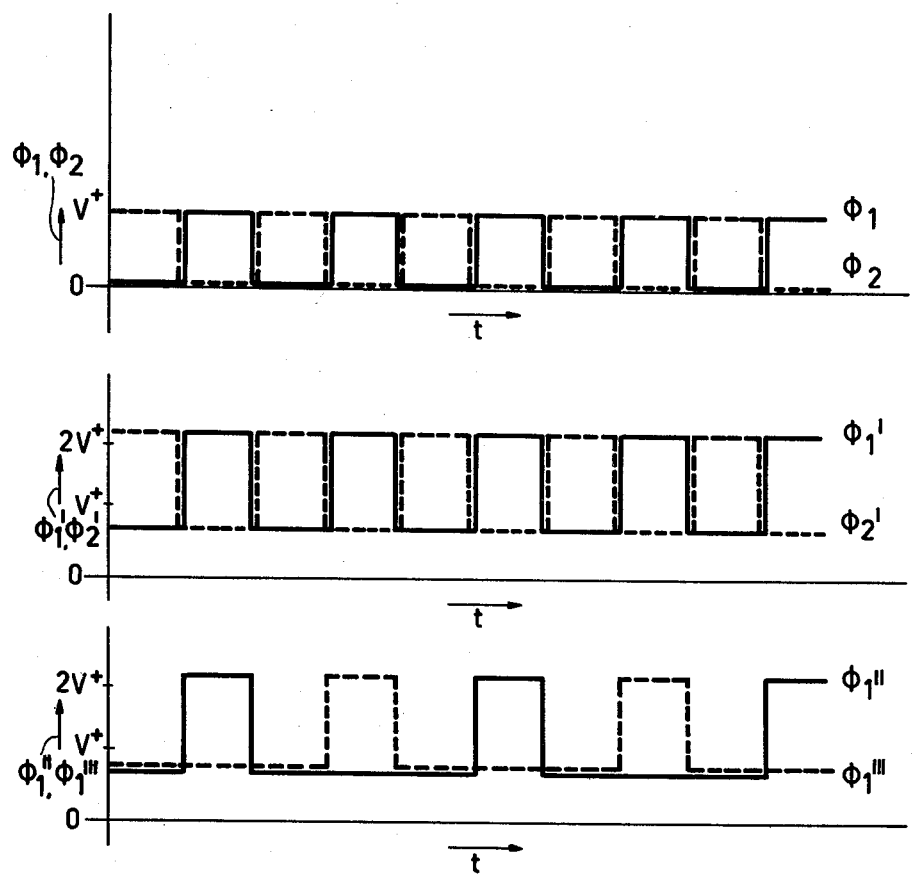
FIG. 7 represents the clock signals $\phi_1$, $\phi_2$, $\phi'_1$, $\Phi''_1$ and $\phi'''_1$, for use in the charge transfer device in accordance with FIGS. 2a, 2b, 2c, 3, 4, 5 and 6.

FIG. 3 shows a part of a further elaborated embodiment of the charge transfer device in accordance with the invention equipped with N-channel MOSFET's, which is in conformity with the block diagram of FIG. 2a. Here the feedback path is constituted by an inverting buffer amplifier $B_1$ with a gain factor $-k$, whose high-ohmic input is connected to the output of the cell $S_{2n}$, and a capacitor $C_p$, which together with the transistor $T_a$ is connected in series between the output of the buffer amplifier $B_1$ and the input of the cell $S_{2n-1}$. The transistor $T_b$ is arranged in parallel with the capacitor $C_p$. The control electrode of transistor $T_a$ is driven by the clock signal $\phi'_1$ and the control electrode of transistor $T_b$ is controlled by the clock signal $\phi'_2$. The control electrodes of the cells of the charge transfer device are controlled by the clock signals $\phi_1$ and $\phi_2$, which are shown in FIG. 7 and, as can be seen, are switched between the voltages O and V+ *in phase opposition. The clock signals* $\phi'_1$ and $\phi'_2$ are derived from the clock signals $\phi_1$ and $\phi_2$, respectively by, as is also shown in FIG. 7, adding a suitable direct voltage to the last-mentioned clock signals and, as the case may be, raising the amplitude, so that the transistors $T_a$ and $T_b$ can operate as switches.

The operation of the switch is as follows: assume that a charge packet arrives at the output of the cell $S_{2n}$. The clock signal $\phi_1$ and the clock signal $\phi'_1$ will then be high, so that transistor $T_a$ will conduct. At this instant a signal voltage appears on the output of the cell $S_{2n}$ as a result of the charge packet. A fraction k of said signal charge is then inverted and applied to the capacitor $C_p$, which will drain charge from the output of the cell $S_{2n-2}$, where the next charge packet and the residual charge of the first-mentioned signal charge packet are located. By means of the gain factor k of the buffer amplifier $B_1$ and the ratio between the value of the capacitor $C_p$ and the value of the capacitance $C_{2n-2}$ the derived charge (compensation charge) can be made equal to $2n\epsilon$ times the magnitude of the original signal charge packet, so that full compensation for the 1st-order residual charge is obtained. It will be evident that the output signal $V_o$ of the charge transfer device can also be taken from the output of the buffer amplifier $B_1$.

Figure 4:
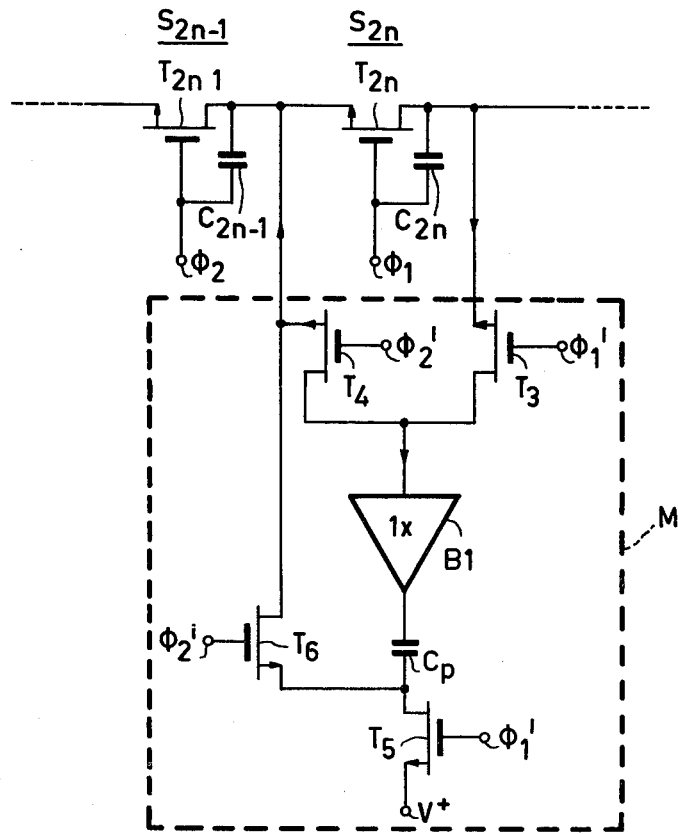
FIG. 4 shows a part of an embodiment of a charge transfer device in accordance with the invention comprising a feedback loop producing a delay by a fraction of a clock period.

FIG. 4 shows a part of a more elaborate embodiment of the charge transfer device in accordance with the invention equipped with n-channel MOSFET's, which device is in conformity with the block diagram of FIG. 2b. Here the feedback path includes a buffer amplifier $B_1$ and a capacitor $C_p$. The input of the non-inverting buffer amplifier $B_1$ is connected to the output of the cell $S_{2n}$ via transistor $T_3$ and to the input of the same cell via transistor $T_4$. The output of the buffer amplifier is connected to the one electrode of capacitor $C_p$, while the other electrode of said capacitor is connected to a point of fixed potential (for example V+) via a transistor $T_5$. Further, the circuit comprises a transistor $T_6$, which is arranged between the other electrode of the capacitor $C_p$ and the input of the cell $S_{2n}$. The control electrodes of the transistors $T_3$ and $T_5$ are controlled by the clock signal $\phi'_1$, while the control electrodes of transistors $T_4$ and $T_6$ are controlled with the clock signal $\phi'_2$, which clock signals $\phi'_1$ and $\phi'_2$ are derived from the clock signals $\phi_1$ and $\phi_2$ in the same way as stated previously.

The operation of the circuit is as follows:

When a signal charge packet arrives at the output of the cell $S_{2n}$, $\phi'_1$ is high and transistors $T_3$ and $T_5$ conduct. The clock signal $\phi'_2$ is then low and transistors $T_4$ and $T_6$ are cut-off. A charge sample, derived from the signal charge packet, is then stored in capacitor $C_p$. If the clock signal $\phi'_1$ now goes low, transistors $T_3$ and $T_5$ will cut off, and if subsequently the clock signal $\phi_2$ goes high, transistors $T_4$ and $T_6$ will be turned on. The charge in capacitor C must now be transferred, because there is a fixed relationship between the input and the output voltage of the buffer amplifier $B_1$. Capacitor $C_p$ stores the signal-dependent charge. It is advantageous for the gain of the buffer amplifier $B_1$ to be unity, so that for the buffer amplifier the input voltage is equal to the output voltage. In that case capacitor C should be discharged completely and thereby withdraw charge (compensation charge) from the output of the cell $S_{2n-1}$ via transistor $T_6$. Obviously the magnitude of the compensation charge can be influenced by the magnitude of the capacitor $C_p$. Full 1st-order compensation is obtained when:

$$C_p/C_{2n-1} = 2n\epsilon$$

In the same way as for preceding circuit, it is again possible to take an output signal $V_o$ from the output of the buffer amplifier $B_1$.

Figure 5:
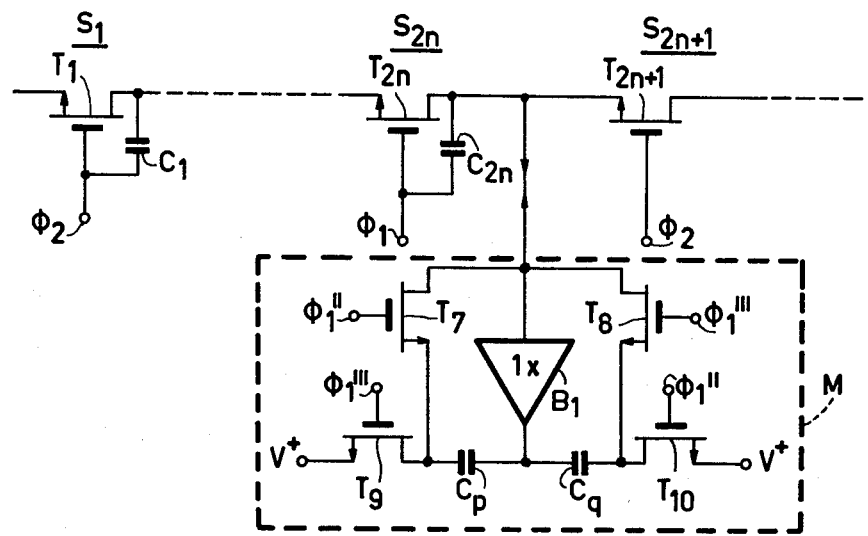
FIG. 5 shows a part of an embodiment of the charge transfer device in accordance with the invention comprising a feedback loop producing a delay by one full clock period.

FIG. 5 shows a part of a further embodiment of the charge transfer device in accordance with the invention equipped with N-channel MOSFET's, which device is in conformity with the block diagram shown in FIG. 2c. Again the feedback path comprises a non-inverting buffer amplifier $B_1$ having unity gain and further two capacitors $C_p$ and $C_q$, which are alternately charged and discharged. The input of the buffer amplifier $B_1$ is connected to the output of the cell $S_{2n}$ and the output of the buffer amplifier $B_1$ is connected to one electrode of each of the capacitors $C_p$ and $C_q$. The other electrode of capacitor $C_p$ is connected to the input of the buffer amplifier $B_1$ via transistor $T_7$ and to a point of fixed potential (for example $V+$) via transistor $T_9$. The other electrode of capacitor $C_q$ is connected to the input of the buffer amplifier $B_1$ via transistor $T_8$ and to the point of fixed potential via transistor $T_{10}$. The control electrodes of transistors $T_7$ and $T_{10}$ receive a signal $\phi''_1$, which is derived from the clock signal $\phi'_1$ by removing the even pulses, while the control electrode of transistors $T_8$ and $T_9$ receive a signal $\phi'''_1$, which is obtained by removing the odd pulses from the clock signal $\phi'_1$, as shown in FIG. 7. For correct operation of the circuit the clock signals $\phi''_1$ and $\phi'''_1$ should have a d.c. offset relative to the clock signal $\phi_1$, as already stated with reference to FIGS. 3 and 4.

The operation of the circuit of FIG. 5 is as follows:

When a signal charge packet arrives at the output of the cell $S_{2n}$, one of the capacitors, for example $C_p$, will be charged to the corresponding signal voltage so that for example, transistor $T_9$ conducts. When assuming that capacitor $C_q$ was not charged, the simultaneous turn-on of transistor $T_8$ has had no consequences. The next time that $\phi_1$ goes high, transistors $T_7$ and $T_{10}$ will be turned on, so that the charge present in capacitor $C_p$ is used for cancelling the residual charge of the previous signal charge packet and the capacitor $C_q$ is charged to the signal voltage corresponding to the signal charge packet now being transferred.

Figure 6:
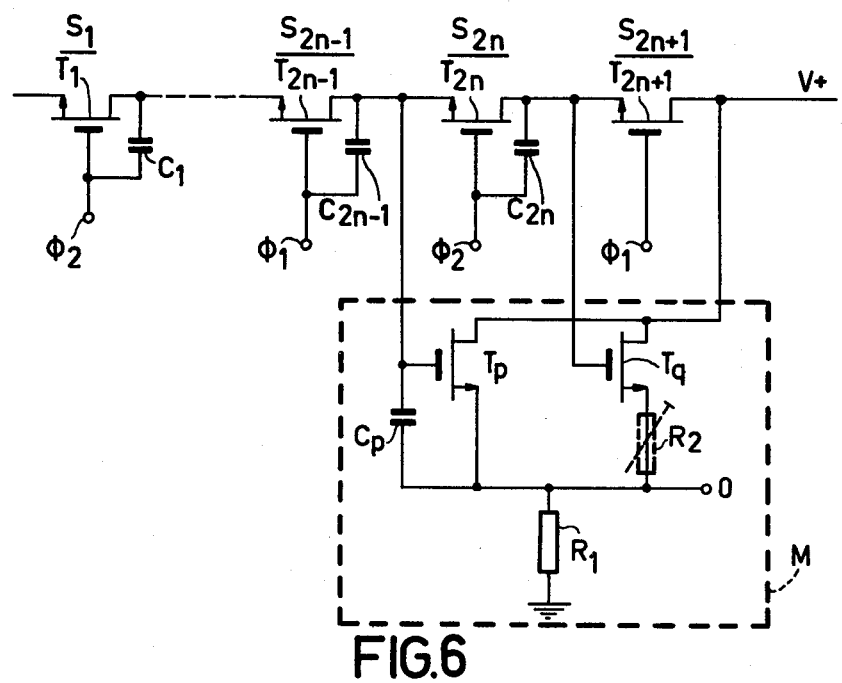
FIG. 6 shows a part of a preferred embodiment of the charge transfer device in accordance with the invention comprising a feedback loop, in which a delay equal to a fraction of the clock period occurs and in which the use of switching transistors has been avoided.

FIG. 6 shows a part of a preferred embodiment of a charge transfer device in accordance with the invention equipped with n-channel MOSFET's comprising a feedback loop which produces a delay by half the clock period and for which no additional clock signals are required. The output of the cell $S_{2n-1}$ is connected to the gate electrode of the follower transistor $T_p$ and the output of the cell $S_{2n}$ to the gate electrode of the follower transistor $T_q$. Capacitor $C_p$ is connected between the gate electrode and the source electrode of transistor $T_p$. The source electrodes of transistors $T_p$ and $T_q$ are commoned to a point of fixed potential, for example, ground, via the resistor $R_1$. The drain electrodes of transistors $T_p$ and $T_q$ are connected to a suitable supply voltage $V+$ and so is the drain electrode of transistor $T_{2n+1}$, which serves for supplying the reference charge to the capacitor $C_{2n}$ of the cell $S_{2n}$ during the time the clock signal $\phi_1$ is high.

The operation of this circuit is as follows. For the sake of convenience, the threshold voltages of the transistors are ignored. Assume that at a specific instant the clock signal $\phi_1$ goes high and the clock signal $\phi_2$ goes low. The gate electrode of transistor $T_p$ will then receive a voltage via the capacitor $C_{2n-1}$ which is higher than that received by the gate electrode of transistor $T_q$ at said instant. The capacitor $C_{2n-1}$ has previously been charged to a voltage equal to $V+$ and on the leading edge of the clock signal $\phi_1$ the gate electrode of transistor $T_p$ is now driven by a voltage $2V+$. Owing to the signal charge packet which is simultaneously applied to the capacitor $C_{2n-1}$, said voltage will be lower than $2V+$ but will remain higher than $V+$. Since transistors $T_p$ and $T_q$ may be regarded as a differential stage, transistor $T_p$ will be turned on and transistor $T_q$ will be turned off. Thus, capacitor $C_p$ will remain discharged. Subsequently, the clock signal $\phi_1$ goes low and the clock signal $\phi_2$ goes high. The gate electrode of transistor $T_q$ will now become positive relative to that of transistor $T_p$. Transistor $T_p$ will now be cut off and transistor $T_q$ will consequently be turned on, the latter behaving as a follower for the voltage across capacitor $C_{2n}$, which will again be $2V+$ minus the signal contribution. Said voltage is applied to the lower plate of the capacitor $C_p$, while the upper plate of said capacitor receives the voltage $V+$ via transistor $T_{2n}$. Thus, in capacitor $C_p$ a charge is stored equal to:

$$(V+ - V_s) C_p$$

As soon as the clock signal $\phi_1$ goes high again and the clock signal $\phi_2$ goes low, the voltage on the gate electrode of transistor $T_p$ will again become so high that said transistor is turned on. As a result of this, capacitor $C_p$ is now discharged, its charge, which has a sign opposite to that of the charge on capacitor $C_{2n-1}$, being transferred to the last-mentioned capacitor. At this instant capacitor $C_{2n-1}$ contains the next signal charge packet and the residual charge of the preceding signal charge packet. Thus, the charge of capacitor $C_{2n-1}$ becomes $(V+ - V'_s - 2n\epsilon V_s) C_{2n-1} - (V+ - V_s) C_p$, where $-V'_s \cdot C_{2n-1}$ is the signal charge packet now stored in capacitor $C_{2n-1}$ and $-2n\epsilon V_s \cdot C_{2n-1}$ is the residual charge of the preceding signal charge packet. For $$C_p/C_{2n-1} = 2n\epsilon$$

the terms with $V_s$ will cancel each other, so that by selecting the correct ratio for the values of the capacitors $C_p$ and $C_{2n-1}$ the 1st-order error is eliminated.

For fine control it may be useful to arrange a variable attenutor between the source electrodes of transistors $T_p$ and $T_q$. This can be achieved by arranging a variable resistor R2 in the source circuit of transistor $T_q$ as is shown by a broken line in FIG. 6. Said variable resistor is adjusted so that $$\frac{C_p}{C_{2n-1}} \cdot \frac{R_2}{R_1 + R_2} = 2n\epsilon$$

so that the 1st-order error is eliminated. Although the illustrated embodiments are all two-phase charge transfer devices, this does not imply that the scope of the invention is limited to this category of charge transfer devices. It is possible to apply the compensation principles described to multiphase charge transfer devices. The invention can be used not only in bucket-bridge type CTD's, but also in CTD's of the charge-coupled type.

What is claimed is:

1. A charge transfer device comprising a series of similar semiconductor cells ($S_1 \ldots S_{2n}$) each having an input, an output, a capacitance ($C_1 \ldots C_{2n}$) for the storage of charge which represents information and at least one charge-transfer control electrode, the input of each cell but the first being coupled to the output of the preceding cell, and control means for applying clock signals to the control electrodes of consecutive cells ($S_1 \ldots S_{2n}$) in accordance with a cyclic permutation in order to control the charge transfer in the charge transfer device, a residual portion of the stored charge remaining behind during said charge transfer and resulting in a "smearing" effect, characterized in that the device comprises a detector (M), which is coupled to the output of one of the cells ($S_{2n}$) for detecting the magnitude of a signal charge packet on said output and therefrom deriving an attenuated compensation charge packet, and that the device further comprises feedback path means for adding said attenuated compensation charge packet in a compensating sense to the charge packet which lags said charge packet by one clock period to compensate for said "smearing" effect.

2. A charge transfer device as claimed in claim 1, characterized in that said detector (M) comprises a buffer amplifier ($B_1$) having a high-ohmic input and a low-ohmic output and a first capacitor ($C_p$).

3. A charge transfer device as claimed in claim 2, characterized in that the buffer amplifier ($B_1$) is inverting and its input is connected to the output of one of the cells ($S_{2n}$) of the charge transfer device, of which cell the control electrode can be controlled by a first clock signal ($\phi_1$), one of the electrodes of the first capacitor ($C_p$) being connected to the output of the buffer amplifier ($B_1$) via the main current path of a first transistor ($T_a$), the main current path of a second transistor ($T_b$) being arranged in parallel with the first capacitor ($C_p$) and the other electrode of the first capacitor ($C_p$) being connected to the output of the cell, ($S_{2n-2}$), of which cell the control electrode can also be controlled by the first clock signal ($\phi_1$) and which cell precedes the first mentioned cell ($S_{2n}$).

4. A charge transfer device as claimed in claim 3, characterized in that the control electrode of the first transistor ($T_a$) can be controlled by a signal ($\phi'_1$) derived from the first clock signal ($\phi_1$) and the control electrode of the second transistor ($T_b$) can be controlled by a signal ($\phi'_2$) derived from a second clock signal ($\phi_2$).

5. A charge transfer device as claimed in claim 2, characterized in that the buffer amplifier ($B_1$) is noninverting and its input is connected, via the main current path of a third transistor ($T_3$) to the output of one of the cells ($S_{2n}$) of the charge transfer device, whose control electrode can be controlled by a first clock signal ($\phi_1$), the input of the buffer amplifier $B_1$ further being connected to the input of said cell ($S_{2n}$) via the main current path of a fourth transistor, the output of the buffer amplifier ($B_1$) being connected to one of the electrodes of the first capacitor $C_p$, the other electrode of the first capacitor ($C_p$) being connected to a point of fixed potential ($V+$) via the main current path of the fifth transistor ($T_5$) and to the input of said cell ($S_{2n}$) via the main current path of a sixth transistor ($T_6$).

6. A charge transfer device as claimed in claim 5, characterized in that the control electrodes of the third and the fifth transistors ($T_3$, $T_5$) can be controlled by a signal ($\phi'_1$) derived from the first clock signal ($\phi_1$) and the control electrodes of the fourth and the sixth transistor can be controlled by a signal ($\phi'_2$) derived from a second clock signal ($\phi_2$).

7. A charge transfer device as claimed in claim 2, characterized in that the buffer amplifier ($B_1$) is noninverting and a second capacitor ($C_q$) forms part of said detector (M), the input of the buffer amplifier ($B_1$) being connected to the output of one of the cells ($S_{2n}$) of the charge transfer device, whose control electrode can be controlled by a first clock signal ($\phi_1$), the input of the buffer amplifier ($B_1$) further being connected to the one electrode of the first capacitor ($C_p$) and the second capacitor ($C_q$), via the main current path of a seventh and eighth transistor respectively ($T_7$ and $T_8$ respectively), to the one electrode of the first capacitor ($C_t$) and the second capacitor ($C_q$) respectively, the one electrode of first capacitor ($C_p$) and the second capacitor ($C_q$) being respectively connected to a point of fixed potential ($V+$) via the main current path of a ninth and a tenth transistor respectively ($T_9$ and $T_{10}$ respectively) and the other electrode of the first capacitor ($C_p$) or the second capacitor ($C_q$) being connected to the output of the buffer amplifier ($B_1$).

8. A charge transfer device as claimed in claim 7, characterized in that the control electrode of the seventh and the tenth transistor ($T_7$, $T_{10}$) can be controlled by a first switching signal ($\phi''_1$) derived from the first clock signal ($\phi_1$) and the control electrodes of the eighth and the ninth transistor ($T_8$, $T_9$) can be controlled by a second switching signal ($\phi'''_1$) derived from the first clock signal ($\phi_1$).

9. A charge transfer device as claimed in claim 2, characterized in that said detector (M) comprises a further buffer amplifier having a high-ohmic input and a low-ohmic output, the buffer amplifier and the further buffer amplifier being non-inverting and only those input signal values which exceed a specific threshold value being transferred, the input of the buffer amplifier being connected to the input of one of the cells ($S_{2n}$) of the charge transfer device, the input of a further buffer amplifier being connected to the output of the said one of the cells ($S_{2n}$) of the charge transfer device, the input of a further buffer amplifier being connected to the output of the said one of the cells ($S_{2n}$), the first capacitor ($C_p$) being arranged between the input and the output of the buffer amplifier and the outputs of the buffer amplifier and the further buffer amplifier being interconnected via a coupling circuit.

10. A charge transfer device as claimed in claim 9, characterized in that the buffer amplifier and the further buffer amplifier each comprise a transistor ($T_p$ and $T_q$ respectively), arranged as a follower.

11. A charge transfer device as claimed in claim 9 or 10, characterized in that the coupling circuit is a resistive attenuator ($R_1$, $R_2$).

12. A charge transfer device as claimed in claim 11, characterized in that at least one of the resistors of the coupling circuit is a variable resistor ($R_2$).

13. A charge transfer device as claimed in claims 9 or 10, characterized in that the coupling circuit is also connected to a signal output (O).

14. A charge-transfer device as claimed in claim 1 or 2, characterized in that each of the cells ($S_1 \ldots S_{2n}$) comprises at least one charge-transfer transistor ($T_1-T_{2n}$), the main-current path of this transistor being arranged between the input and the output of the cell whose associated control electrode also constitutes the control electrode of the transistor.

* * * * *